(12) United States Patent
Vacheron

(10) Patent No.: US 6,740,809 B2
(45) Date of Patent: May 25, 2004

(54) CONFIGURATION FOR SEALING THREE-DIMENSIONAL ENCLOSURES

(75) Inventor: Phillip L. Vacheron, Westerville, OH (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/374,794

(22) Filed: Feb. 25, 2003

(65) Prior Publication Data
US 2003/0164595 A1 Sep. 4, 2003

Related U.S. Application Data
(60) Provisional application No. 60/360,813, filed on Mar. 1, 2002.

(51) Int. Cl.[7] .............................. H02G 3/08; F16J 15/02
(52) U.S. Cl. ................... 174/50; 174/17 CT; 174/65 R; 277/641; 439/76.1
(58) Field of Search .............................. 174/50, 17 CT, 174/17 R, 50.2, 50.5, 65 R; 220/3.2, 3.8, 4.02; 439/76.1, 76.2; 277/641, 642, 644, 647, 594, 596, 626

(56) References Cited

U.S. PATENT DOCUMENTS

| | | | | |
|---|---|---|---|---|
| 3,643,968 A | * | 2/1972 | Horvath | 277/642 |
| 4,192,520 A | * | 3/1980 | Hasegawa | 277/641 |
| 4,298,204 A | * | 11/1981 | Jinkins | 277/641 |
| 4,669,432 A | * | 6/1987 | Harada | 277/647 |
| 5,536,023 A | * | 7/1996 | Surbrook et al. | 277/647 |
| 5,550,324 A | * | 8/1996 | Black et al. | 174/52.3 |
| 5,700,977 A | * | 12/1997 | Ford et al. | 174/65 R |
| 6,309,257 B1 | * | 10/2001 | Huang | 174/50.5 |
| 6,492,590 B1 | * | 12/2002 | Cheng | 174/50 |
| 6,577,504 B1 | * | 6/2003 | Lofland et al. | 174/16.1 |

* cited by examiner

*Primary Examiner*—Dean Reichard
*Assistant Examiner*—Angel R. Estrada
(74) *Attorney, Agent, or Firm*—Steve Mendelsohn

(57) ABSTRACT

An enclosure for electronic components has a chassis, a cover mountable to the chassis, and a face plate mountable to the chassis/cover sub-assembly. The top side of the cover has a generally U-shaped groove running along three sides to receive a friction-fitted gasket that forms a portion of the environmental seal for the enclosure. Each end of the groove has a J-shaped portion within which the gasket loops back on itself. The bottom of each J-shaped portion is open on the cover's front side, such that the side of the gasket will protrude beyond the front side of the chassis/cover sub-assembly, thereby providing a portion of the seal when the face plate is mounted onto the chassis/cover sub-assembly. The J-shaped portions account for contraction of the gasket due to strain relief after the gasket is placed in the groove and provide increased frictional force that further inhibits such strain relief.

16 Claims, 4 Drawing Sheets

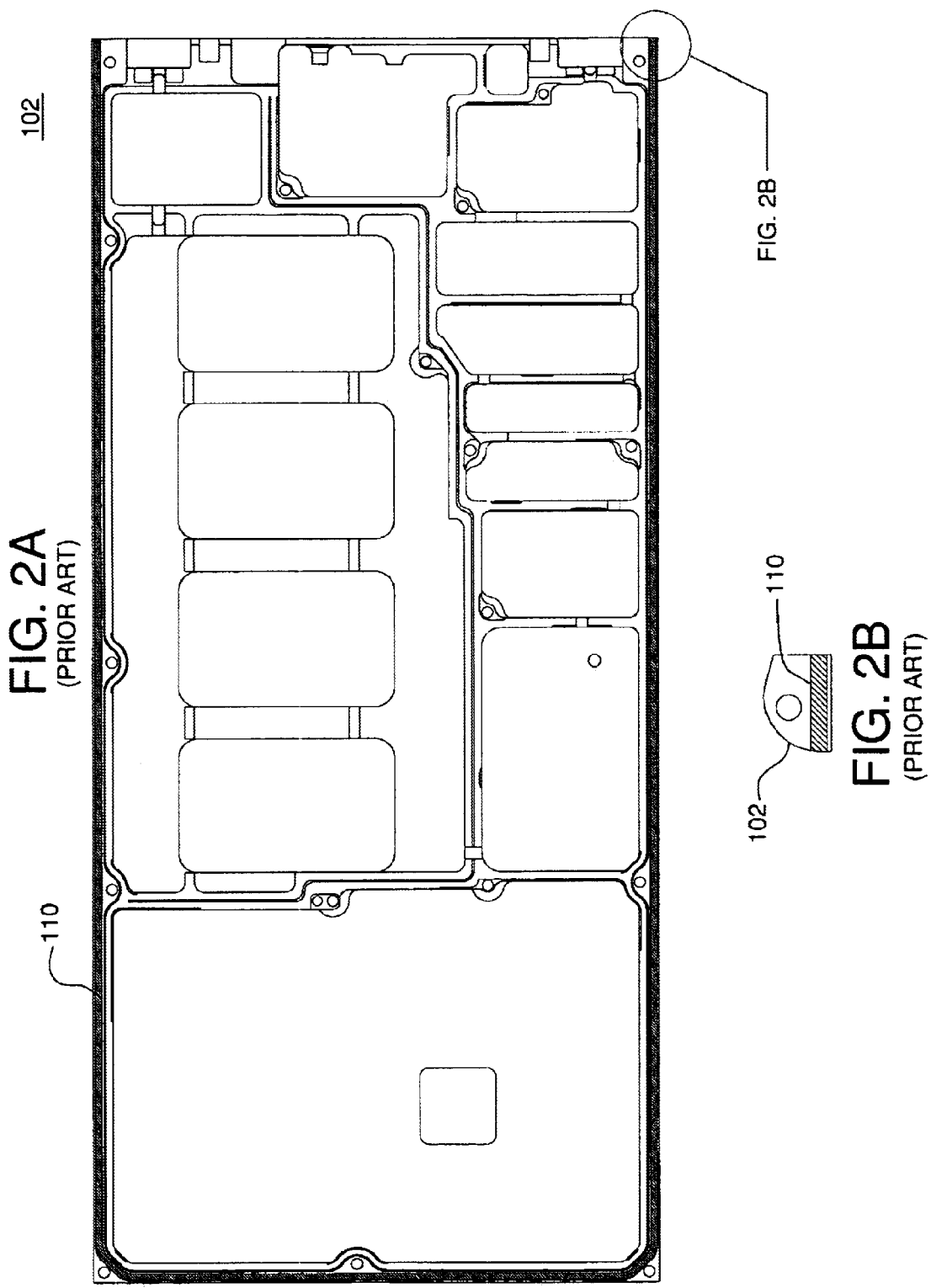

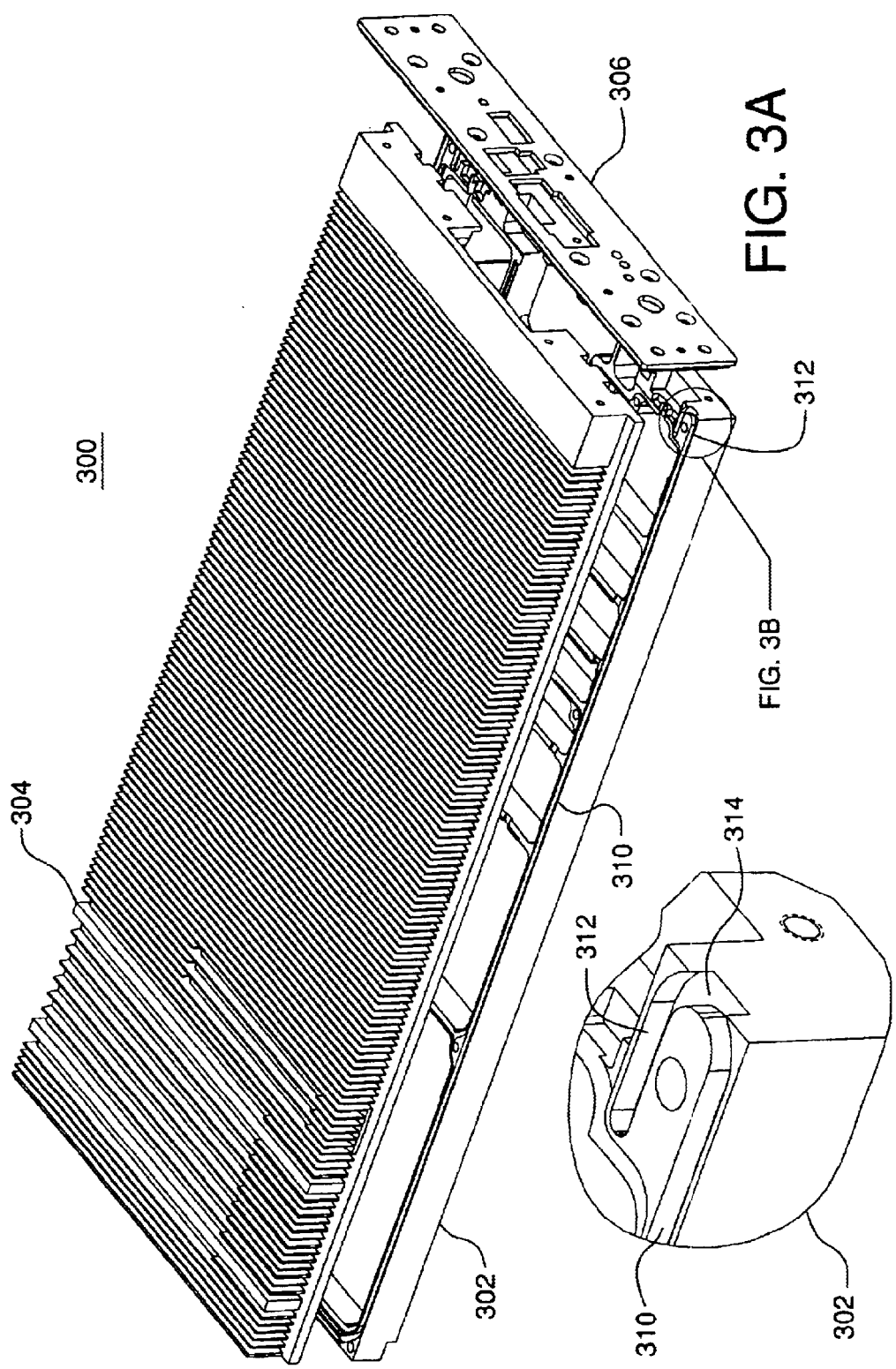

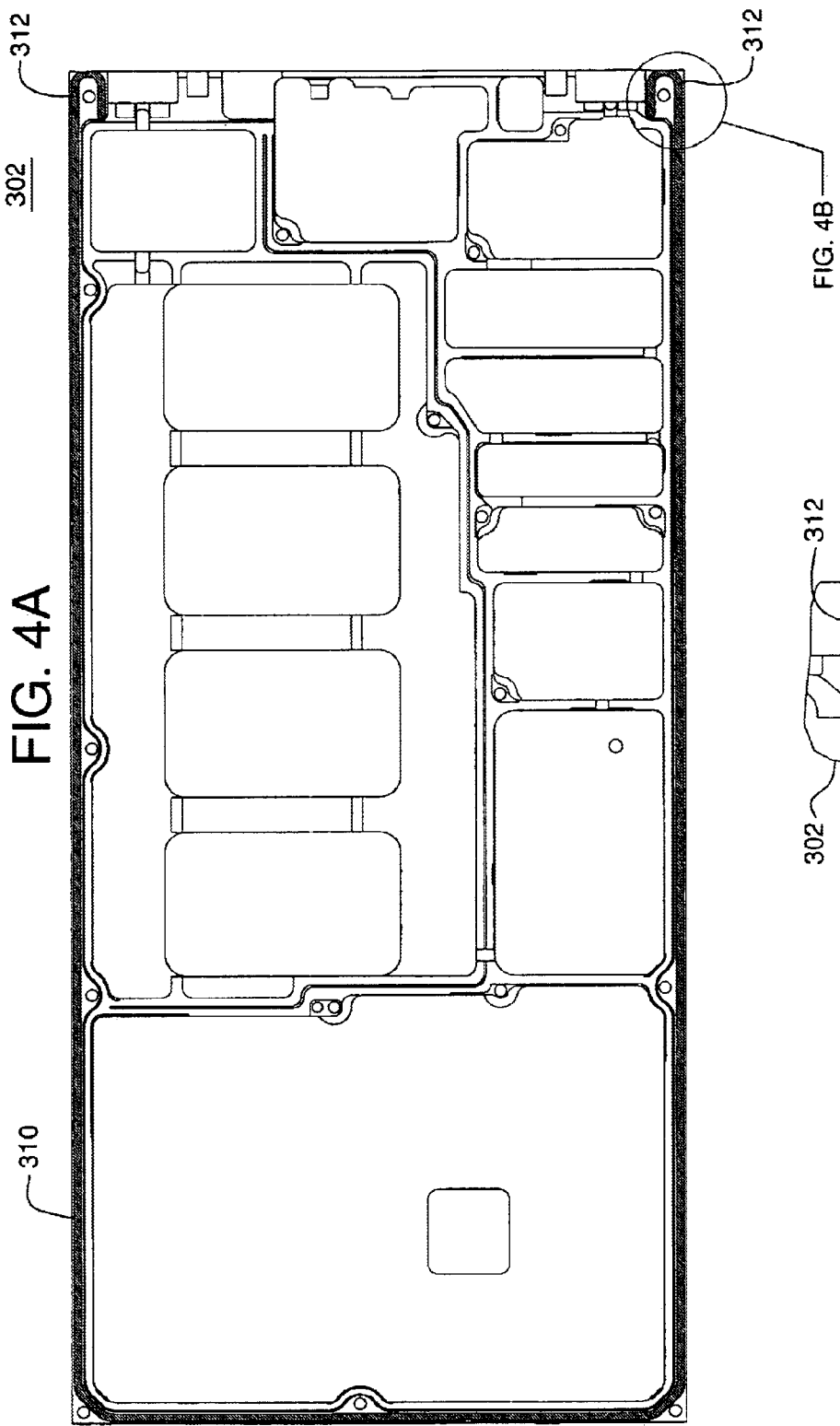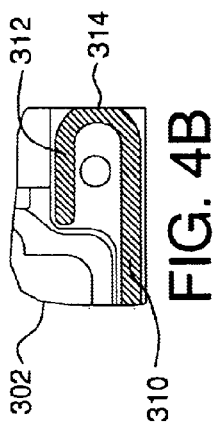

CONFIGURATION FOR SEALING THREE-DIMENSIONAL ENCLOSURES

CROSS-REFERENCE TO RELATED APPLICATIONS

This application claims the benefit of the filing date of U.S. provisional application No. 60/360,813, filed on Mar. 1, 2002.

FIELD OF THE INVENTION

The present invention relates to enclosures for housing electronic components and other sensitive equipment.

BACKGROUND OF THE INVENTION

In order to protect electronic components from the adverse affects of ambient environmental conditions, such components are often housed within enclosures that are environmentally sealed to prevent moisture and other corrosive or otherwise debilitating gases and liquids located outside the enclosure from reaching the components inside.

FIG. 1A shows an exploded perspective view of an exemplary, conventional enclosure 100 for housing electronic components. As shown in FIG. 1A, enclosure 100 contains a cover 102, a chassis 104, and a face plate 106. Electronic components (not shown) such as printed wire boards and individual electronic modules are mounted within or on chassis 104. Cover 102 is then mounted to chassis 104 to form a partial assembly that encloses the electronic components on five of the six sides of enclosure 100 (i.e., the top, bottom, left, right, and back sides). The remaining, front side of enclosure 100 is formed by mounting face plate 106 onto the front side of the partial assembly formed by chassis 104 and cover 102. Face plate 106 has apertures 108 that provide electrical access to the electronic components housed in enclosure 100.

FIG. 1B shows a detail of one corner of cover 102 of enclosure 100, FIG. 2A shows a top view of cover 102, and FIG. 2B shows a top view of the corner shown in FIG. 1B. As shown in the FIGS. 1–2, cover 102 has a generally U-shaped groove 110 running around the periphery of the top side of cover 102 along the left, right, and back sides of cover 102. Groove 110 is adapted to retain a deformable (e.g., silicone rubber or polymer) gasket (not shown) that runs along the entire length of groove 110. In particular, groove 110 is specifically designed such that the gasket will extend above the top surface of cover 102 along the entire length of groove 110. As such, when cover 102 is mounted to chassis 104, the gasket will be compressed by the mating surfaces of those parts to form a sufficiently tight seal between cover 102 and chassis 104 along the left, right, and back sides of the resulting partial assembly referred to herein as the chassis/cover sub-assembly. Moreover, the width of the groove is preferably slightly undersized compared to the size (e.g., width or diameter) of the gasket to provide a friction fit for the gasket.

Furthermore, it is desirable for the ends of the gasket to protrude beyond the front side of the chassis/cover sub-assembly at both ends of groove 110 to form a portion of the sealing configuration when face plate 106 is mounted onto the front side of the sub-assembly.

Ideally, during assembly of an enclosure, such as enclosure 100 of FIGS. 1–2, the gasket is inserted into the groove using only vertical force, making sure that the gasket extends beyond the front side of the cover on both ends of the groove. The ends of the gasket are then trimmed as necessary to achieve a desired amount of protrusion. The cover is then mounted over the chassis to form the chassis/cover subassembly, followed by the mounting of the face plate onto the front side of the chassis/cover subassembly.

In practice, however, an assembler might insert the gasket within the groove by applying both vertical and lateral pressure to the gasket, e.g., using a finger or thumb, from one end of the groove around the periphery of the cover to the other end of the groove. As such, assemblers tend to stretch the gaskets as they are inserted into the grooves, thereby creating strain in the gaskets. After the ends of a gasket are trimmed, the strain on the gasket may overcome the friction fit, causing the gasket to relieve itself (i.e., contract along its length). As a result, one or both ends of the gasket may pull back into the groove, thereby eliminating one or both of the desirable, front-side protrusions at the ends of the groove. The subsequent application of the chassis and face plate may then fail to appropriately seal the assembly. In particular, the resulting "gaps" in the enclosure can cause leakage failure for UL testing or other quality issues for the electronic components.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 2A shows a top view of the cover of FIG. 1A;

FIG. 2B shows a top view of the corner shown in FIG. 1B;

FIG. 3A shows an exploded perspective view of an exemplary enclosure for housing electronic components, according to one embodiment of the present invention;

FIG. 3B shows a detail of one corner of the cover of the enclosure of FIG. 3A;

FIG. 4A shows a top view of the cover of FIG. 3A; and

FIG. 4B shows a top view of the corner shown in FIG. 3B.

DETAILED DESCRIPTION

Figures 1A, 1B:
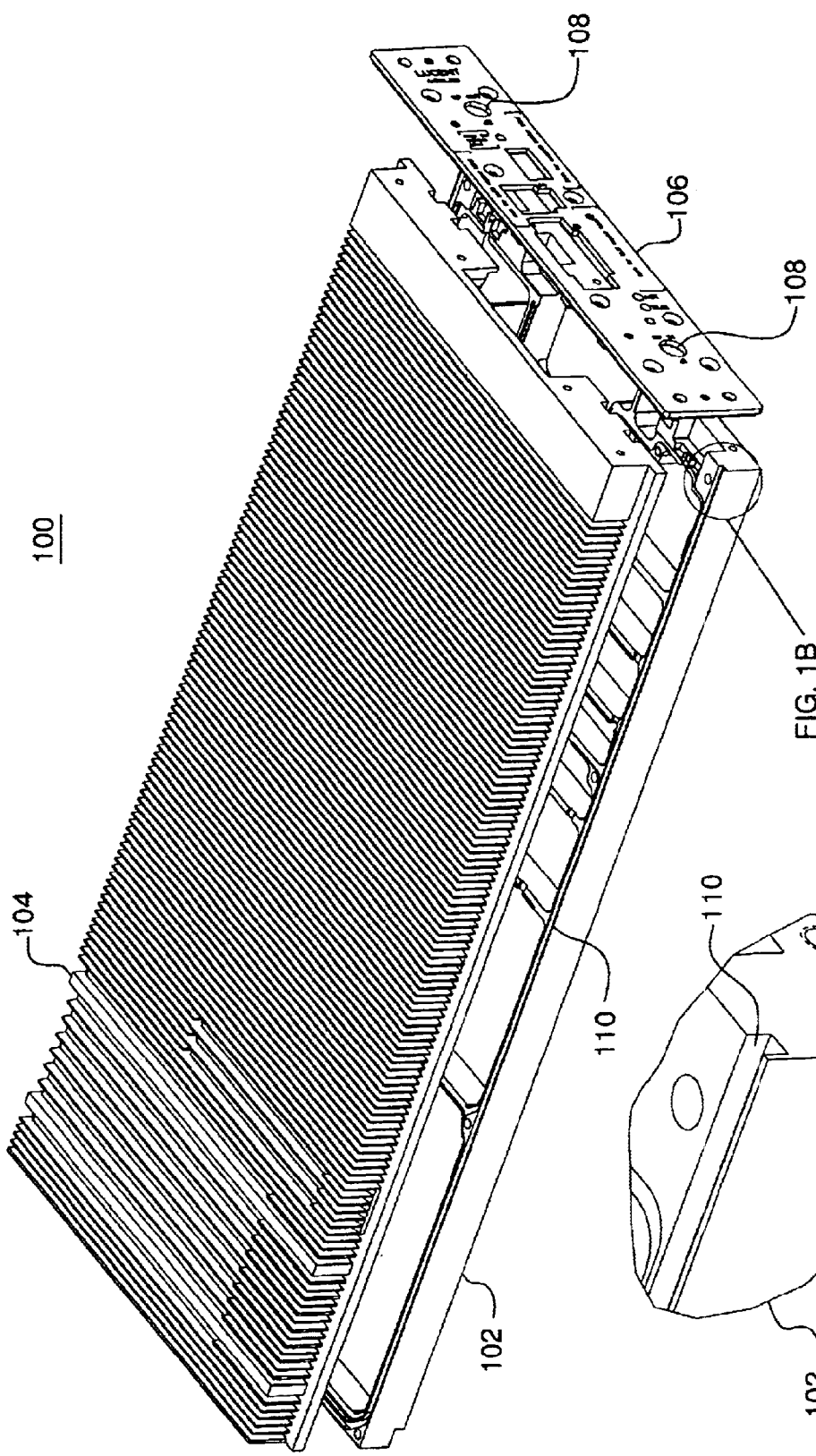
FIG. 1A shows an exploded perspective view of an exemplary, conventional enclosure for housing electronic components.
FIG. 1B shows a detail of one corner of the cover of the enclosure of FIG. 1A.

FIG. 3A shows an exploded perspective view of an exemplary enclosure 300 for housing electronic components, according to one embodiment of the present invention. Like enclosure 100 of FIGS. 1–2, enclosure 300 has a cover 302, a chassis 304, and a face plate 306, which are assembled in an analogous manner as the corresponding parts of enclosure 100 to form enclosure 300.

FIG. 3B shows a detail of one corner of cover 302 of enclosure 300, FIG. 4A shows a top view of cover 302, and FIG. 4B shows a top view of the corner shown in FIG. 3B. Like cover 102 of enclosure 100, cover 302 has a generally U-shaped groove 310 running around the periphery of the top side of cover 302 along the left, right, and back sides of cover 302. However, unlike in cover 102, groove 310 in cover 302 has a J-shaped portion 312 located at each end of groove 310.

According to a preferred embodiment of the present invention, enclosure 300 is assembled by inserting a suitable gasket into groove 310 of cover 302 along the entire length of the groove including looping the gasket back upon itself along the two J-shaped portions 312 located at the ends of groove 310. The ends of the gasket are positioned and trimmed as necessary to extend to the ends of the J-shaped portions of the groove. After the gasket has been inserted, chassis 304 and then face plate 306 can be mounted onto cover 302 to form an environmentally sealed enclosure 300.

As shown in the details of FIGS. 3B and 4B, the portion of the groove corresponding to the "bottom of the J" (314) is open to the front side of the cover and is narrower than the size (e.g., width or diameter) of the gasket. As such, when the gasket is inserted into the groove, the side of the gasket will protrude beyond the front side of the partial assembly formed by cover 302 and chassis 304. This protrusion then forms a portion of the sealing configuration when face plate 306 is mounted onto the front side of the chassis/cover sub-assembly.

Depending on the particular implementation, the length of the looped-back portion of the gasket is sufficient (e.g., about ½ inch) to accommodate any typical strain relief (i.e., contraction of the gasket length of about 1/10 inch) that might occur after the gasket has been placed in the groove by an assembler. Furthermore, the J-shaped portions of the groove provide additional friction that tends to decrease any such contraction. As such, the sealing configuration of FIGS. 3–4 can provide a more reliable seal for enclosure 300 than is provided by the sealing configuration of prior art enclosure 100 of FIGS. 1–2.

In an alternative embodiment, rather than looping back on itself along the top side of cover 302, a cover could have a groove that extends over and down the front side of the cover to form an L-shaped portion at each end of the groove. In that case, the side of the gasket would extend beyond both the top side and the front side of the cover to form a portion of the sealing configuration both between the chassis and the cover as well as between the chassis/cover sub-assembly and the face plate.

Although the present invention has been described in the context of a cover having a generally U-shaped groove with two J-shaped portions at the two ends of the groove, the invention is not so limited. In general, the present invention may be implemented in the context of an enclosure part having a groove with a different general shape (including a generally L-shaped groove running along only two sides of the part and a generally I-shaped groove running along only one side of the part), where the groove has one or two shaped portions at one or both ends of the groove, where the groove loops back on itself or otherwise deviates from the general direction of the shape of the groove (including one or more L-shaped portions).

Although the present invention has been described in the context of an enclosure having the gasket-holding groove on a surface of the cover of the enclosure, the present invention could also be implemented in the context of an enclosure having the gasket-holding groove on a surface of the chassis of the enclosure. Furthermore, although the present invention has been described in the context of environmentally sealed enclosures for electronic components having a chassis, a cover, and a face plate, the present invention can also be implemented in the context of partially or completely sealed enclosures having three or more enclosure parts for other applications.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A part for an enclosure, wherein:

the part has a groove adapted to receive a gasket for forming a seal when the enclosure part is mated to another part of the enclosure, wherein the groove runs along a first surface of the part and has two ends;

the groove has a shaped portion at each of one or both ends of the groove, wherein the shape of each shaped portion deviates from a general direction of the groove at each portion;

the shaped portion of the groove has a bottom part and a looped-back part;

the bottom part of the shaped portion is exposed at a second surface of the part different from the first surface; and the looped-back part forms an angle of less than 90 degrees with respect to the general direction of the groove, such that, when the gasket is inserted into the groove:

a part of the gasket corresponding to the bottom part of the shaved portion is exposed at the second surface of the part; and a part of the gasket corresponding to the looped-back part of the shaped portion is not exposed at the second surface of the part.

2. The invention of claim 1, wherein:

the enclosure is an enclosure for electronic components, the enclosure having a chassis, a cover, and a face plate;

the part is the chassis or the cover of the enclosure;

the cover is adapted to be mounted to the chassis with the gasket placed in the groove to form a chassis/cover sub-assembly having an environmental seal between the cover and the chassis; and the enclosure further comprises a face plate adapted to be mounted to the chassis/cover sub-assembly.

3. The invention of claim 2, wherein:

the groove has a general U-shape running along the first surface of the part and two J-shaped portions at the two ends of the groove; and when the gasket is placed within the groove, a side of the gasket protrudes beyond a surface of the chassis/cover sub-assembly at each J-shaped portion to form a portion of an environmental seal between the face plate and the chassis/cover sub-assembly.

4. The invention of claim 3, wherein:

the groove is designed to form a friction fit with the gasket when the gasket is placed within the groove;

the width of the groove at each J-shaped portion is smaller than the size of the gasket such that the gasket will protrude beyond the second surface of the part adjacent to the first surface having the groove, wherein the face plate is adapted to be mounted to the second surface of the part; and the length of each J-shaped portion is designed to account for contraction of the gasket due to strain relief after the gasket is placed in the groove.

5. The invention of claim 1, wherein the groove is designed to form a friction fit with the gasket when the gasket is placed within the groove.

6. The invention of claim 1, wherein the width of the groove at each shaped portion is smaller than the size of the gasket such that the gasket will protrude beyond the second surface of the part adjacent to the first surface having the groove.

7. The invention of claim 6, wherein:

when the gasket is placed within the groove, a side of the gasket protrudes beyond the second surface of the part at the shaped portion to form a portion of an environmental seal between the part and another part of the enclosure.

8. The invention of claim 1, wherein the length of each shaped portion is designed to account for contraction of the gasket due to strain relief after the gasket is placed in the groove.

9. An enclosure comprising a chassis, a cover adapted to be mounted to the chassis to form a chassis/cover sub-assembly, and a face plate adapted to be mounted to the chassis/cover sub-assembly, wherein:

a part of the enclosure has a groove adapted to receive a gasket for forming a seal when the enclosure part is mated to another part of the enclosure, wherein the groove runs along a first surface of the part and has two ends;

the groove has a shaped portion at each of one or both ends of the groove, wherein the shape of each shaped portion deviates from a general direction of the groove at each portion;

the shaped portion of the groove has a bottom part and a looped-back part;

the bottom part of the shaped portion is exposed at a second surface of the part different from the first surface; and the looped-back part forms an angle of less than 90 degrees with respect to the general direction of the groove, such that, when the gasket is inserted into the groove:
 a part of the gasket corresponding to the bottom part of the shaped portion is exposed at the second surface of the part; and
 a part of the gasket corresponding to the looped-back part of the shaped portion is not exposed at the second surface of the part.

10. The invention of claim 9, wherein:

the enclosure is an enclosure for electronic components;

the part is the chassis or the cover of the enclosure; and the cover is adapted to be mounted to the chassis with the gasket placed in the groove to form the chassis/cover sub-assembly having an environmental seal between the cover and the chassis.

11. The invention of claim 10, wherein:

the groove has a general U-shape running along the first surface of the part and two J-shaped portions at the two ends of the groove; and when the gasket is placed within the groove, a side of the gasket protrudes beyond a surface of the chassis/cover sub-assembly at each J-shaped portion to form a portion of an environmental seal between the face plate and the chassis/cover sub-assembly.

12. The invention of claim 11, wherein:

the groove is designed to form a friction fit with the gasket when the gasket is placed within the groove;

the width of the groove at each J-shaped portion is smaller than the size of the gasket such that the gasket will protrude beyond the second surface of the part adjacent to the first surface having the groove, wherein the face plate is adapted to be mounted to the second surface of the part; and the length of each J-shaped portion is designed to account for contraction of the gasket due to strain relief after the gasket is placed in the groove.

13. The invention of claim 9, wherein the groove is designed to form a friction fit with the gasket when the gasket is placed within the groove.

14. The invention of claim 9, wherein the width of the groove at each shaped portion is smaller than the size of the gasket such that the gasket will protrude beyond the second surface of the part adjacent to the first surface having the groove.

15. The invention of claim 14, wherein:

when the gasket is placed within the groove, a side of the gasket protrudes beyond the second surface of the part at the shaped portion to form a portion of an environmental seal between the part and another part of the enclosure.

16. The invention of claim 9, wherein the length of each shaped portion is designed to account for contraction of the gasket due to strain relief after the gasket is placed in the groove.

* * * * *

UNITED STATES PATENT AND TRADEMARK OFFICE
CERTIFICATE OF CORRECTION

PATENT NO. : 6,740,809 B2
DATED : May 25, 2004
INVENTOR(S) : Phillip L. Vacheron It is certified that error appears in the above-identified patent and that said Letters Patent is hereby corrected as shown below:

<u>Column 4,</u>
Line 22, replace "shaved" with -- shaped --.

Signed and Sealed this

Ninth Day of November, 2004

JON W. DUDAS
*Director of the United States Patent and Trademark Office*